United States Patent [19]

Nakamura et al.

[11] Patent Number: 5,306,662
[45] Date of Patent: Apr. 26, 1994

[54] METHOD OF MANUFACTURING P-TYPE COMPOUND SEMICONDUCTOR

[75] Inventors: Shuji Nakamura; Naruhito Iwasa; Masayuki Senoh, all of Anan, Japan

[73] Assignee: Nichia Chemical Industries, Ltd., Tokushima, Japan

[21] Appl. No.: 970,145

[22] Filed: Nov. 2, 1992

[30] Foreign Application Priority Data

Nov. 8, 1991 [JP] Japan ................................. 3-321353
Dec. 24, 1991 [JP] Japan ................................. 3-357046
Jan. 22, 1992 [JP] Japan ................................. 4-32763
Jan. 29, 1992 [JP] Japan ................................. 4-40280

[51] Int. Cl.$^5$ .................................................. H01L 21/203
[52] U.S. Cl. ........................................ 437/107; 437/942;
437/965; 437/126; 437/133; 257/201; 372/46;
148/DIG. 64; 148/DIG. 3; 148/DIG. 4
[58] Field of Search ................ 437/107, 942, 965, 126,
437/132, 133; 372/46; 257/201; 148/DIG. 3,
DIG. 4, DIG. 64

[56] References Cited

U.S. PATENT DOCUMENTS

| | | | |
|---|---|---|---|
| 4,615,766 | 10/1986 | Jackson et al. | 437/942 |
| 4,960,728 | 10/1990 | Schaake et al. | 148/DIG. 3 |
| 5,042,043 | 8/1991 | Hatano et al. | 372/46 |
| 5,182,670 | 1/1993 | Khan et al. | 257/201 |

OTHER PUBLICATIONS

Japanese Journal of Applied Physics, vol. 28, No. 12, Dec. 1989, pp. L2112-L2114.
Journal of Luminescence 48 & 49 (1991), pp. 666-670.
Fehrenbruch et al. "II-VI photovoltaic heterojunctions for solar energy conversion" Appl. Phys. Lett 25(10), Nov. (1974), pp. 605-608.
Moriizumi et al. "Epitaxial Vapor Growth of ZnTe on InAs" Japan. Jr. Appl. Phys. 9 (1970), pp. 849-850.
Yoshikawa et al. "Use of dimethyl hydrazine as a new acceptor dopant source in metalorganic vapor phase epitaxy of ZnSe" in Journal of Crystal Growth 101 (1990), pp. 305-310.
Yoshikawa et al. "Effects of Ar ion laser irradiation on MOVPE of ZnSe using DMZn and DMSe as reactants" in Jr. Crystal Growth 107 (1991), pp. 653-658.

Primary Examiner—Olik Chaudhuri
Assistant Examiner—Ramamohan Rao Paladugu
Attorney, Agent, or Firm—Nixon & Vanderhye

[57] ABSTRACT

A method for manufacturing a III-V Group compound or a II-VI Group compound semiconductor element by VPE, comprising the step of annealing a grown compound at 400° C. or higher, or irradiating electron beam the grown compound at 600° C. or higher.

8 Claims, 5 Drawing Sheets

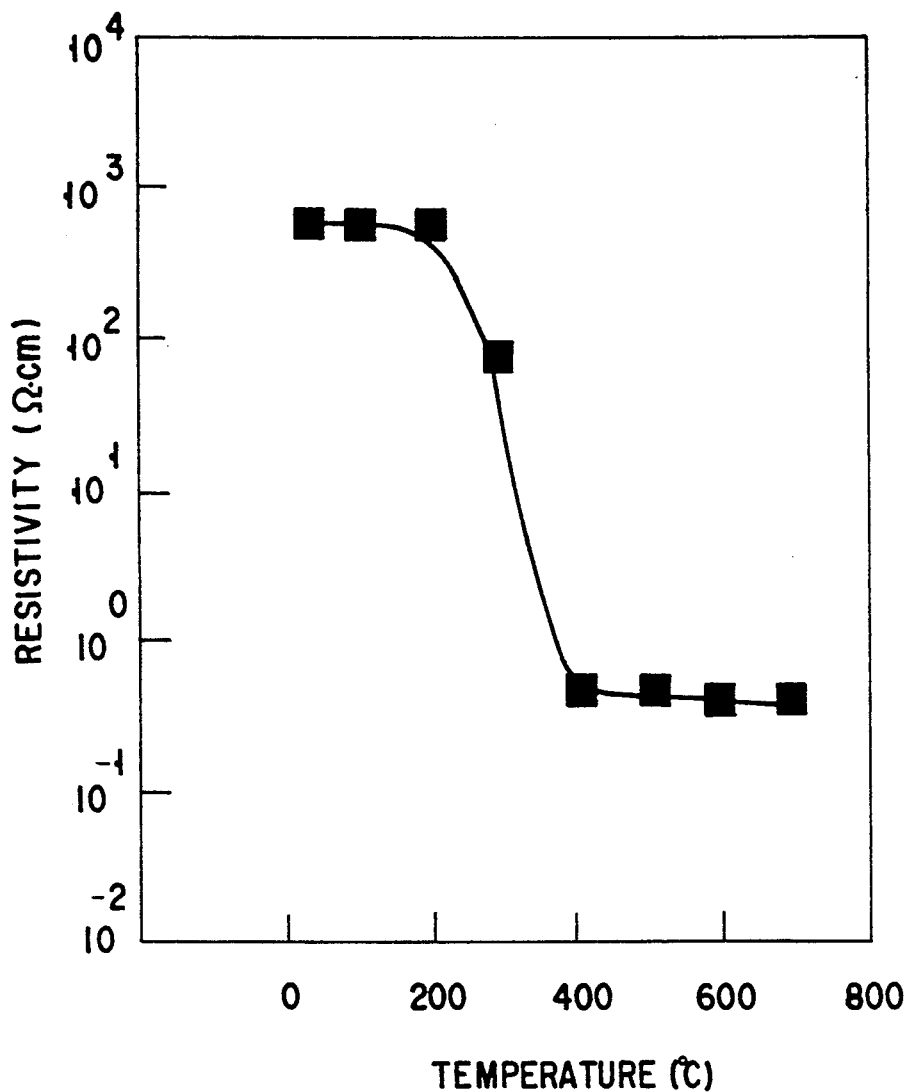
F I G. 7

METHOD OF MANUFACTURING P-TYPE COMPOUND SEMICONDUCTOR

BACKGROUND OF THE INVENTION

1. Field of the Invention

The present invention relates to a method of manufacturing a II-VI Group compound semiconductor device and a III V Group compound semiconductor device used as a light-emitting device, for example, a UV-emitting laser diode, blue light-emitting laser diode, UV-emitting diode, or blue light-emitting diode and more specifically, to a method of manufacturing a low-resistance p-type compound semiconductor from a III-V Group compound semiconductor and a II-VI Group compound semiconductor from by doping p-type compounds thereinto as impurities.

2. Description of the Related Art

Studies on blue light-emitting elements have been generally conducted using ZnSe, which is a II-VI Group compound, SiC, a IV-IV Group compound, or GaN, a III-V Group compound.

Of the types of compounds mentioned above, it was recently found that a gallium nitride series compound [$Ga_xAl_{1-x}N$ (where $0 \leq x \leq 1$)] semiconductor exhibits excellent semiconductor light emission at room temperature, and therefore much attention is now being paid to the GaN series semiconductor.

A blue light-emitting basically has a structure in which n type, and i-type or p-type GaN series semiconductors each represented by general formula $Ga_xAl_{1-x}N$ (where $0 \leq x \leq 1$) are stacked in turn on a sapphire substrate.

There are several well-known methods for growing a III-V Group compound, such as the metalorganic chemical vapor deposition (MOCVD) method, the molecular beam epitaxy method, and the hydride vapor phase epitaxy method. As an example, the MOCVD method will be briefly described. In this method, a metalorganic compound gas serving as a reaction gas (for example, trimethyl gallium (TMG), trimethyl aluminum (TMA), or ammonium) is introduced into a reaction container (vessel) in which a sapphire substrate is placed. Then, while maintaining the epitaxial growth temperature as high as 900° C.–1100° C., an epitaxial film of a III-V Group compound is grown on the substrate. By supplying suitable impurity gas during the growth of the film according to circumstances, a multilayer made of the n-type and p-type III-V Group compound semiconductors can be manufactured. In general, Si is a well-known n-type impurity; however in the case of a GaN series compound semiconductor, there is a tendency for the semiconductor to exhibit the n-type characteristics even without doping an n-type impurity. Some of the well-known examples of p-type impurities are Mg and Zn.

There can be proposed a method described below, as an improved version of the MOCVD method. When a III-V Group compound semiconductor is directly epitaxial-grown on a sapphire substrate at a high temperature, the surface condition of the crystals, and the crystallinity will be extremely degraded. In order to avoid this, before the compound is grown at the high temperature, an AlN buffer layer is formed on the substrate at a temperature as low as about 600° C., and then the compound is grown on the buffer layer at a high temperature. The fact that the crystallinity of GaN can be remarkably improved by the above-mentioned technique is disclosed in Published Unexamined Japanese Patent Application No. 2-229476. Meanwhile, the authors of the present invention disclosed in Japanese Patent Application No. 3-89840, prior to the present application, that a gallium nitride compound semiconductor having a better crystallinity can be formed when a GaN buffer layer is used than when a conventional AlN buffer layer is used.

However, a blue light-emitting device employing a blue color-emitting element including a GaN series compound semiconductor has not yet been developed as a practical device. This is because p-type III-V Group compound semiconductor having a sufficiently-low-resistance cannot be produced by any of the conventional techniques, and therefore a light-emitting element having various types of structure such as p-type double hetero, single hetero, etc. cannot be manufactured. In the case where an epitaxial film is formed by the conventional chemical vapor deposition method, even if the film is grown while doping p-type impurities, it is impossible to make III-V Group compound semiconductor characteristic p-type. And also a semi-insulation material having a high resistivity of $10^8$ Ω·cm or higher, i.e., an i-type semiconductor may be obtained. Consequently, at present, the blue-light-emitting element having a structure of the p-n junction diode cannot be achieved, but a so-called MIS structure is the only one known structure for the blue-color-emitting element, in which structure, a buffer layer, an n-type film, and an i-type film are formed on a substrate in the mentioned order.

Published Unexamined Japanese Patent Application No. 2-257679 discloses a method for reducing the resistance of a high-resistance i-type semiconductor as little as possible to convert into a type close to a p-type one. In this method, a high-resistance i-type GaN compound semiconductor layer into which Mg was doped as a p-type impurity is formed on the top of the multilayer of the GaN compound semiconductor. Then, while maintaining the temperature of the compound not higher than 600° C., electron beams having an acceleration voltage of 5 kV–15 kV are irradiated on the surface so as to reduce the resistance of the layers located in the surface portion within a depth of about 0.5 μm. However, with this method, reduction of the resistance can be achieved only up to the point where electron beams can reach i.e. a very thin surface portion. Further, in the method, the electron beams cannot be irradiated on the entire wafer while scanning the beams, and consequently the resistance cannot be uniformly reduced in the desired surface. Further, this method entails the problem of a very low reproducibility, i.e., the resistance value changes every time electron beam is irradiated to the same sample. With this method, it is impossible to constantly produce blue-light-emitting elements having a high efficiency.

Study is being directed not only to III-V Group compounds, but also to II-VI Group compounds in order that they can be put into practical use. As in the case of the GaN compound production method, the chemical vapor deposition method such as the MOCVD can be used to form a II-VI Group compound semiconductor.

Growth of ZnSe by the MOCVD method will be briefly described. In this method, an metalorganic compound gas (diethylzinc (DEZ), hydrogen selenide ($H_2Se$), etc.) is introduced as reaction gas into a reaction vessel in which a GaAs substrate is placed. Then, while maintaining the epitaxial growth temperature at about 350° C., ZnSe is grown on the substrate. During the growth, an appropriate impurity gas is supplied to the vessel to form an n-type or p-type ZnSe semiconductor. Examples of the type of substrate are GaAs and ZnSe. Further, Cl is a well known n-type impurity, and N is also the well-known p-type impurity.

However, as in the case of the before-mentioned p-type GaN compound, a sufficiently low-resistance p-type ZnSe compound cannot be produced by this conventional technique, and therefore a light-emitting element having various types of structure such as double hetero, single hetero, etc. cannot be manufactured. In the case where eptaxial-growing is performed by the conventional chemical vapor deposition method while doping p-type impurities, the obtained ZnSe compound semiconductor will be a compound having a high resistivity of $10^8$ Ω·cm or higher.

SUMMARY OF THE INVENTION

The purpose of the invention is to provide an improvement of a method of manufacturing a semiconductor element from a II-VI group compound, or III-V group compound, which can be obtained by doping a p-type impurity thereto, more specifically to a method of manufacturing a low-resistivity p-type GaN compound semiconductor element having an uniform resistance value over its entirety regardless of film thickness, and having a structure usable as a light-emitting element with a double or single hetero constitution.

According to the first aspect of the invention, there is provide a method of manufacturing a p-type III-V Group compound semiconductor element by a vapor phase epitaxy method, comprising the steps of:

eptaxial-growing a III-V Group compound by introducing a reaction gas containing a p-type impurity on a substrate; and annealing the compound at a temperature of 400° C. or higher.

According to the second aspect of the invention, there is provided a method of manufacturing a p-type III-V Group compound semiconductor element by a vapor phase epitaxy method, comprising the steps of:

growing a III-V Group compound by introducing a reaction gas containing a p-type impurity on a substrate; and irradiating electron beams on the compound while maintaining a surface temperature of the compound at 600° C. or higher.

According to the third aspect of the invention, there is provided a method of manufacturing a p-type II-VI Group compound semiconductor element by a chemical vapor deposition method, comprising the steps of:

growing a II-VI Group compound by introducing a reaction gas containing a p-type impurity on a substrate; and annealing the compound at a temperature of 300° C. or higher.

According to the fourth aspect of the invention, there is provided a method of manufacturing a p-type III-V Group compound semiconductor element by a vapor phase epitaxy method, comprising the steps of:

growing a II-VI compound by introducing a reaction gas containing a p-type impurity on a substrate; and irradiating electron beams on the compound while maintaining a surface temperature of the compound at 300° C. or higher.

With the method recited in the invention, III-V Group compound semiconductors and II-VI compound semiconductors, which conventionally cannot be converted into low-resistance p-type semiconductors even though p-type impurities are doped thereinto, can be converted into low-resistance p-type semiconductors with high yield. Accordingly, elements having a various types of structure can be produced at a high yield.

Further, with the conventional electron-beam irradiation method, reduction of the resistance can be achieved only in the surface portion of the uppermost layer. In the invention, the entire portion of the p-type-impurity-doped III-V Group compound semiconductor or the II VI Group compound semiconductor can be converted into p-type, uniformly within the surface area as well as in the thickness direction. In addition, it is possible to form thick layers of these semiconductors by this method, and therefore blue-light or green-light emitting elements with a high level of brightness can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a graph showing the relationship between the annealing temperature of a p-type impurity doped ZnSe compound semiconductor layer and the resistivity thereof annealed at the temperature.

DETAILED DESCRIPTION OF THE PREFERRED EMBODIMENTS

The present invention is provided to an improved method of manufacturing a p-type compound semiconductor.

According to the present invention a III-V Group compound semiconductor or a II-VI group compound semiconductor can be manufactured as a p-type compound semiconductor.

Further, according to the invention, each layer of the compounds is formed by the vapor phase epitaxy method, and then the formed layer is annealed at a predetermined temperature, while each layer is irradiated by electron beam on the layer, with being kept the surface temperature of the layer at a predetermined temperature.

The first aspect of the invention is provided to a method of manufacturing a p-type impurity doped III-V Group compound semiconductor by a vapor phase epitaxy method wherein after forming p-type impurities doped compound layers, the formed layers are annealed at a predetermined temperature.

In this method, the annealing step is carried out at a temperature of 400° C. or higher. The annealing temperature is preferably 600° C.–1200° C. The annealing can be performed at over 1200° C., but this may cause high cost. In the annealing step, the temperature within the above-mentioned range is fixed constant, and the time is not less than 1 minute, preferably 10 minutes or more.

Even if the annealing temperature is 1000° C. or higher, decomposition of the compound can be prevented by pressurizing the compound with nitrogen. Thus, p-type III-V Group compound semiconductors each having an excellent crystallinity can be stably obtained.

Figure 1:
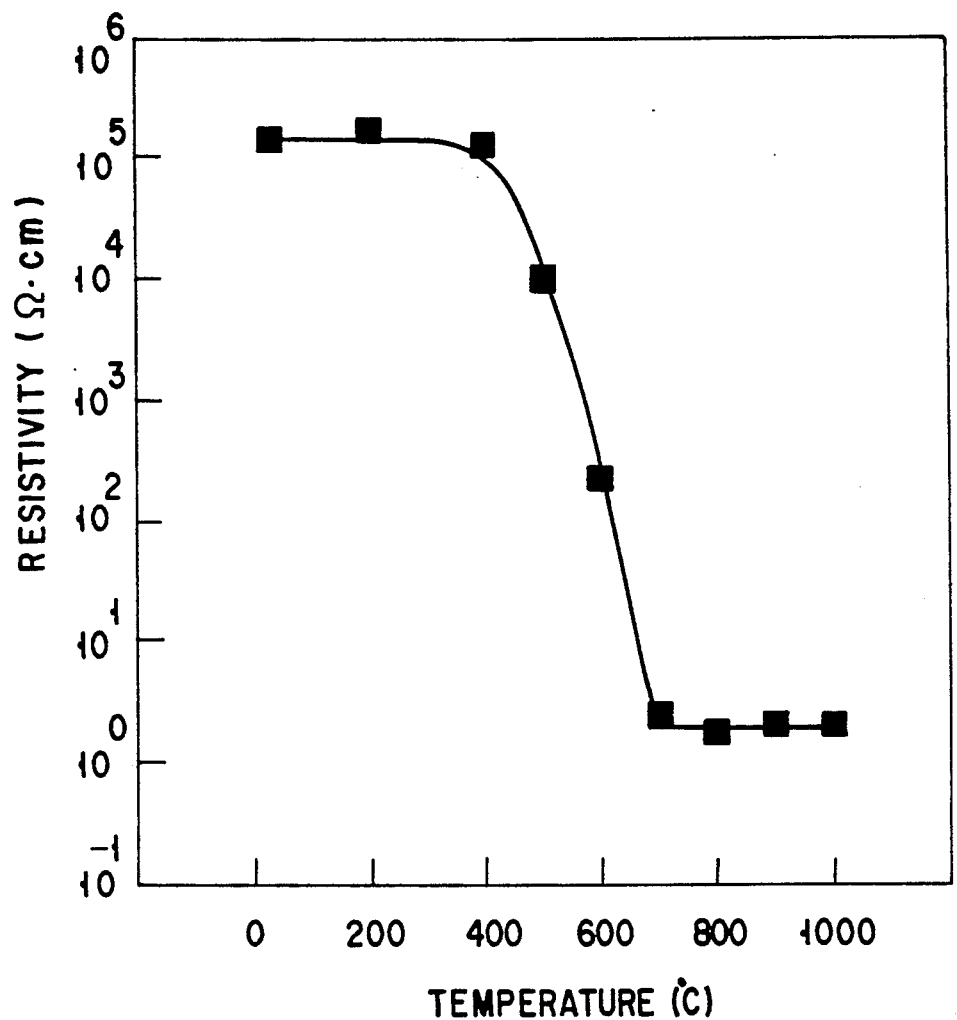
FIG. 1 is a graph showing the relationship between the temperature for annealing and the resistivity of a compound annealed at the temperature.

FIG. 1 shows a property of a p-type-impurity-doped GaN series compound semiconductor as a III-V Group compound semiconductor, and is a graph showing the relationship between an annealing temperature and the resistance value of the GaN series compound semiconductor annealed at the temperature. As can be seen in FIG. 1, the high-resistivity GaN series compound semiconductor can be converted into a low-resistivity p-type impurity compound semiconductor by annealing. In the graph, the resistivity obtained by the Hall measurement on the annealed GaN series compound semiconductor is plotted as a function of the annealing temperature. The used GaN series compound semiconductor was formed by growing a GaN buffer layer on a sapphire substrate by the MOCVD method, followed by formation of a 4 $\mu$m thick GaN layer on the buffer layer while doping Mg thereinto as a p-type impurity. The data plotted on FIG. 1 were obtained as results of annealing the substrate having these layers in a nitrogen atmosphere for 10 minutes at various temperatures using an annealing equipment.

As is clear from this graph, the resistivity of the Mg-doped GaN layer sharply dropped around the point where the temperature exceeded 400° C. When the temperature was increased to higher than 700° C., the GaN layer exhibited a substantially constant low-resistivity p-type property, indicating the effect of annealing. For comparison, the Hall measurement was carried out for a GaN layer before annealing and after annealing at 700° C. or higher. Before annealing, the GaN layer had a resistivity of $2 \times 10^5$ $\Omega$·cm and a hole carrier density of $8 \times 10^{10}$/cm$^3$, whereas after annealing, the layer had a resistivity of 2 $\Omega$·cm and a hole carrier density of $2 \times 10^{17}$/cm$^3$. FIG. 1 shows a case of only the GaN layer, but it was confirmed that a p-type impurity-doped Ga$_x$Al$_{1-x}$N ($0 \leq x \leq 1$) also exhibits a similar result.

Next, the 4 $\mu$m-thick GaN layer annealed at 700° C. was etched to reduce the thickness thereof to 2 $\mu$m, and the Hall measurement was performed for the GaN layer. The result indicated that the GaN layer had a resistivity of 3 $\Omega$·cm and a hole carrier density of $2 \times 10^{17}$/cm$^3$, which were very close to those of the same GaN layer before etching. From the results, it can be concluded that a p-type impurity doped GaN layer having an uniform low resistivity in the entire area and in the thickness direction, is obtained by annealing.

Annealing of the p-type-impurity-doped GaN series compound semiconductor layer may be conducted in the reaction vessel after forming the layer, or in an annealing equipment after transferring the substrate having the compound semiconductor layer from the reaction vessel thereinto The annealing may be carried out in a vacuum, or in an N$_2$ atmosphere, or in an inert gas atmosphere of He, Ne, Ar or the like, or an atmosphere of a mixture gas thereof. Most preferably, the annealing should be performed in a nitrogen atmosphere which is pressurized to a level or higher of the decomposition pressure for the GaN compound semiconductor at the annealing temperature With the nitrogen atmosphere pressurizing the GaN compound semiconductor, decomposition and the compound and split-off of N therefrom during annealing can be prevented.

For example, in the case of GaN, the decomposition pressure is about 0.01 atom at a temperature of 800° C., about 1 atom at 1000° C., and about 10 atoms at 1100° C. Consequently, the GaN series compound semiconductor is annealed at 400° C., some decomposition may occur during annealing at 400° C. If decomposition occurs, the crystallinity of the GaN compound semiconductor tends to be degraded. Therefore, as stated before, the decomposition can be prevented by maintaining a pressure of the nitrogen atmosphere no lower than the decomposition pressure at the annealing temperature.

Figure 2:
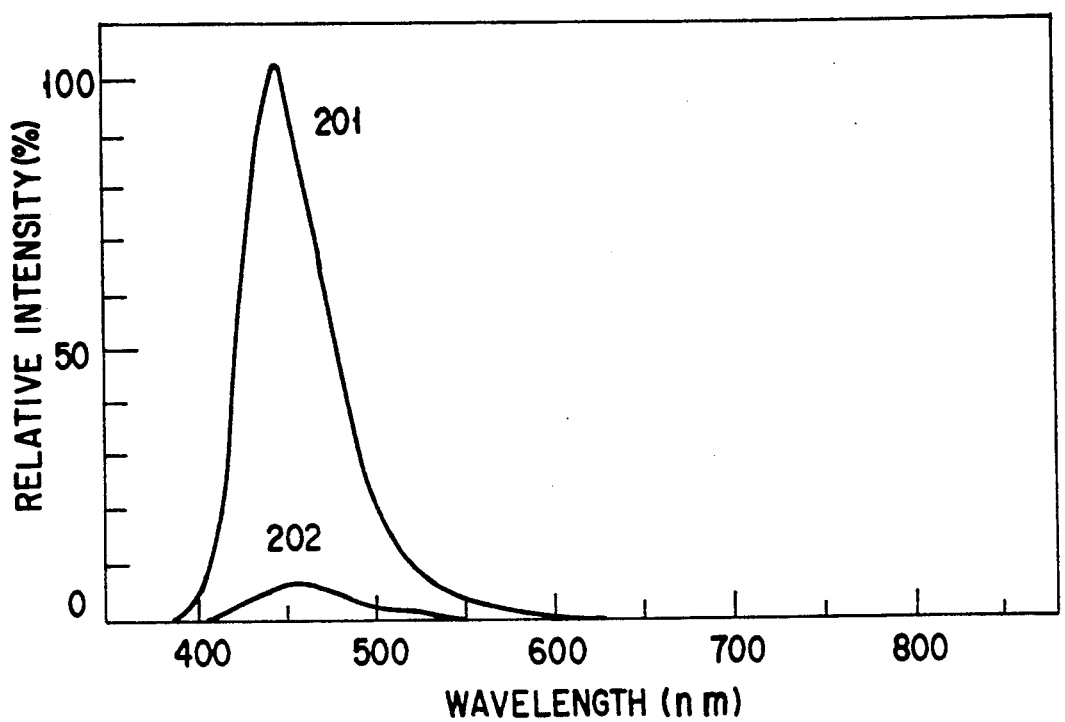
FIG. 2 is a graph showing the relationship between the wavelength and the relative intensity of the photoluminescence of the compound semiconductor

FIG. 2 is a graph showing the difference in crystallinity between GaN series compound semiconductors as III-V Group compound semiconductors one of which annealed under a pressurized condition and the other under an atmospheric pressure condition. Each GaN series compound semiconductor is prepared by forming a GaN buffer layer and a Mg-doped 4 $\mu$m-thick GaN layer on sapphire substrate, and annealing at 1000° C. in a nitrogen atmosphere for 20 minutes under 20 atm of a pressurized condition, or in an atmospheric pressure condition. The p-type GaN layers were irradiated with He-Cd laser beams from He-Cd laser beam source as an excitation light beam source, so as to measure the intensity of photoluminescence as an evaluation of the crystallinity. The evaluation is based on the fact, i.e., the higher the blue-light-emitting intensity of the photoluminescence at 450 nm, the higher the crystallinity. In FIG. 2, a curve 201 indicates the property of the p-type GaN layer annealed under a pressure of 20 atoms, and a curve 202 indicates the case of annealing at atmospheric pressure.

As is clear from FIG. 2, in the case where annealing is carried out at a temperature of 1000° C. or higher, a GaN layer is decomposed by heat to tend to be degraded the crystallinity. However, such heat decomposition can be avoided by pressuring the GaN layer, and this a p-type GaN layer having a good crystallinity can be obtained.

The GaN series compound is preferably represented by general formula $Ga_xAl_{1-x}N$ (where $0 \leq x \leq 1$), or represented by general formula $In_yGa_{1-y}N$ (where $0 \leq y \leq 1$).

Moreover, a cap layer may be formed on the p-type-impurity-doped GaN series compound semiconductor layer before annealing so as to prevent decomposition of the GaN compound during annealing. The cap layer serves as a protective layer. If the cap layer is formed on the compound semiconductor followed by annealing the compound semiconductor at 400° C. or higher, decomposition thereof can be avoided even if annealed, not only in a pressurized state, but also, a pressured-reduced condition, or atmospheric condition. Thus, a p-type GaN compound semiconductor having a low resistivity and a high crystallinity can be obtained.

The cap layer may be formed in the reaction vessel following forming the p-type-impurity-doped GaN series compound semiconductor. Or the substrate having the GaN series compound semiconductor may be transferred from the reaction vessel into a crystal growing method such as a plasma CVD device or the like, so as to form a cap layer on the semiconductor.

The cap layer may be made of an arbitrary material as long as it is formable on the GaN compound, and stable even at a temperature of 400° C. or higher. Preferable examples thereof are $Ga_xAl_{1-x}N$ (where $0 \leq x \leq 1$), $Ga_yIn_{1-y}N$ (where $0 \leq y \leq 1$), $Si_3N_4$, and $SiO_2$. Which is the most preferable material depends upon the annealing temperature.

Usually, the cap layer should have a thickness in the range of about 0.01–5 $\mu$m. If the cap layer is thinner than 0.01 $\mu$m, the advantage as a protection layer cannot be sufficiently obtained, whereas if thicker than 5 $\mu$m, it takes a lot of work to remove the layer to expose the p-type GaN series compound semiconductor after annealing, i.e., not economical. With the conventional electron beam irradiation method, GaN in the uppermost layer is decomposed, degrading the crystallinity, and therefore sufficiently bright light cannot be expected from the manufactured blue-light emitting element. However, such decomposition of GaN can be effectively prevented by the cap layer, blue-light emitting elements each having a high brightness can be manufactured at a high yield.

The substrate may be made of, other than sapphire, SiC, Si, or the like.

Examples of the p-type impurity are Zn, Cd, Be, Mg, Ca, and Ba.

Figure 3:
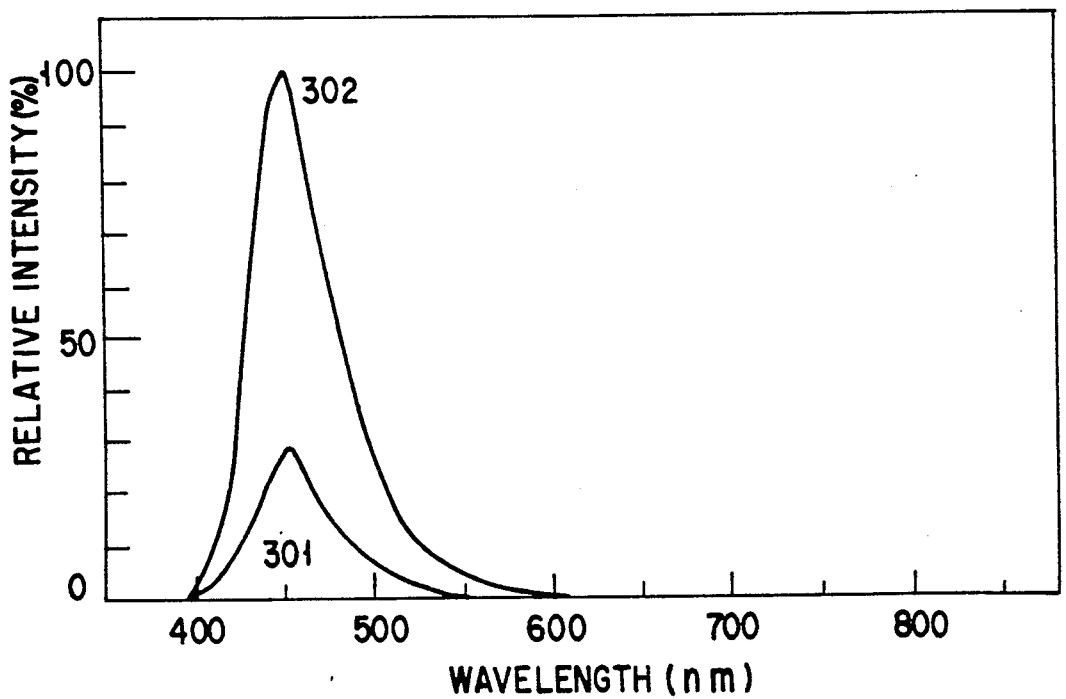
FIG. 3 is a graph showing the relationship between the wavelength and the relative intensity of the photoluminescence of a compound semiconductor having a cap layer.

FIG. 3 is a graph showing comparison with regard to crystallinity between a cap-layered GaN compound semiconductor and an ordinary GaN series compound semiconductor having no cap layer. As can be seen in this figure, a GaN series compound semiconductor having a GaN buffer layer and a Mg-doped 4 $\mu$m-thick GaN layer formed on a substrate (curve 301) and the GaN series compound semiconductor further covered by a 0.5 $\mu$m-thick AlN layer as the cap layer (302) are compared with each other. Each of the semiconductors was prepared by annealing it in a nitrogen atmosphere of atmospheric pressure at 1000° C. for 20 minutes, and etching the cap layer therefrom to expose the GaN series compound semiconductor. Then, the intensity of photoluminescence of each semiconductor was measured.

As shown in FIG. 3, in the p-type GaN layer annealed without a cap layer, the compound is decomposed greatly in high-temperature annealing (see curve 301), resulting in a low intensity of light emission at 450 nm. On the other hand, in the cap-layer-formed (AlN layer) p-type GaN layer, decomposition occurs only to AlN of the cap layer, and the p-type GaN layer remains; therefore the light emitting intensity is maintained as high as a level of not deconposed low sensitivity p-type GaN.

The reason why a low-resistivity p-type GaN series compound semiconductor can be obtained by annealing is assumed as follows:

For growing a GaN series compound semiconductor layer, $NH_3$ is generally used as an N source. During the growth, $NH_3$ is decomposed to atomic hydrogens. These hydrogen atoms bond to Mg, Zn, or the like doped as an acceptor impurity to prevent the p-type impurity from acting as an acceptor. Therefore, a GaN compound semiconductor into which a p-type impurity is doped exhibits a high resistivity.

However, during annealing after growth of the layers, hydrogen bonded to Mg or Zn in the form of Mg-H or Zn-H is released therefrom by heat. Thus, hydrogen leaves the p-type-impurity-doped GaN series compound semiconductor, and the p-type impurity such as Mg or Zn now free from hydrogen can act normally as an acceptor. Accordingly, a low-resistivity p-type GaN series compound semiconductor can be obtained. For the reason stated above, use of a gas containing hydrogen atoms such as $NH_3$, $H_2$, or the like during an annealing atmosphere is not preferable. For the same reason as above, materials containing hydrogen should not be used for the cap layer.

The second aspect of the invention is provided to a method of manufacturing a p-type-impurity-doped gallium nitride series compound semiconductor represented by a vapor phase epitaxy method, in which after growing a p-type impurity doped compound semiconductor layer, electron beams are irradiated on the semiconductor layer while maintaining the surface temperature thereof at 600° C. or higher.

For electron beam irradiation, used may be an electron beam irradiation equipment (for example, SEM) having a sample chamber, and a heating stage placed in the chamber. The irradiation may be carried out while heating by such as a heater the p-type GaN series compound semiconductor so as to maintain the surface temperature thereof at 600° C. or higher. Otherwise, the compound semiconductor ma be irradiated with electron beams of an acceleration voltage in the range of 1 kV–30 kV to maintain the surface temperature of the p-type GaN series compound semiconductor at 600° C. or higher.

Figure 4:
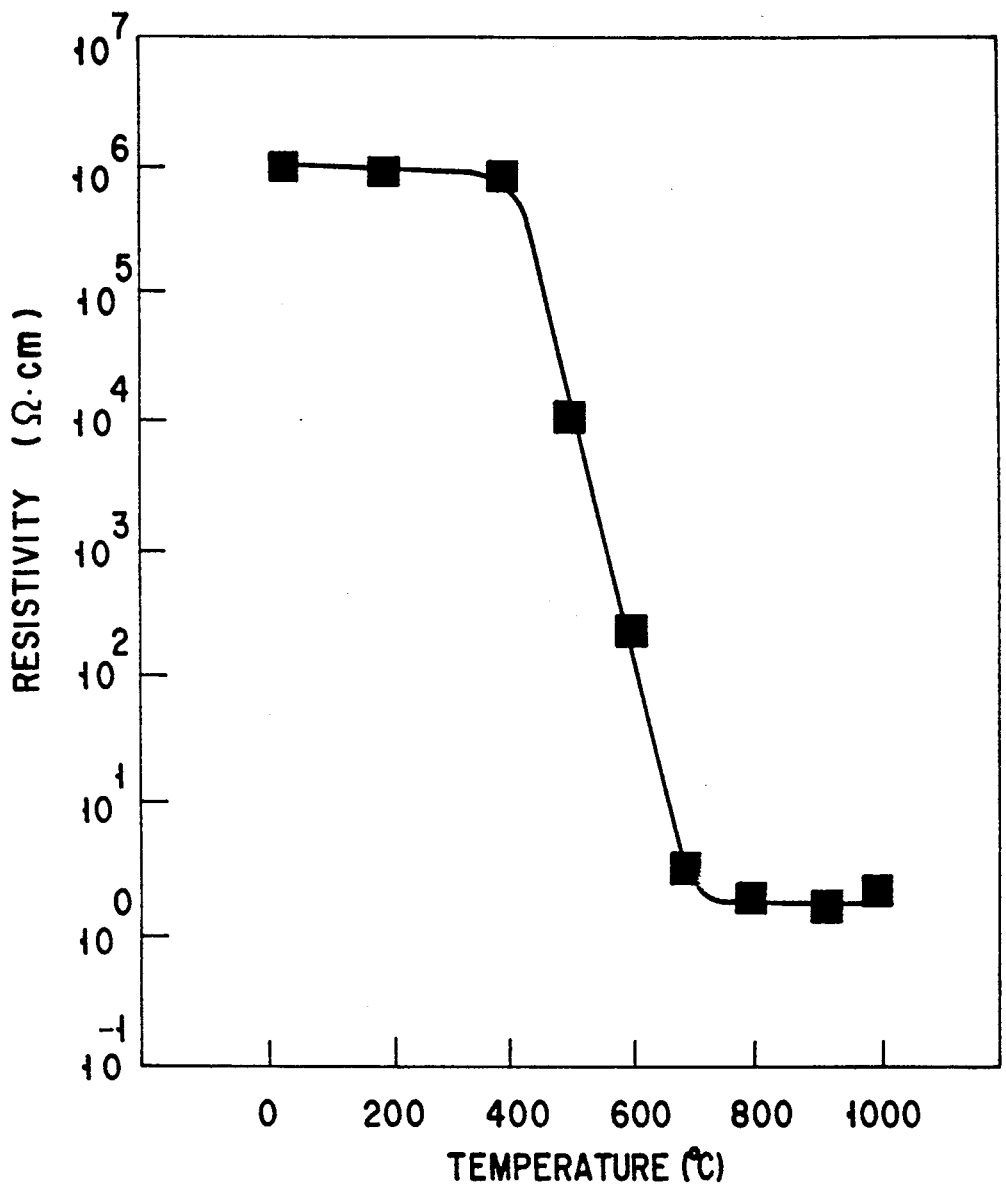
FIG. 4 is a graph showing the relationship between the surface temperature of a III-V Group compound semiconductor layer during electron beam irradiation and the resistivity thereof annealed at the temperature.

FIG. 4 is a graph showing the relationship between the surface temperature of the GaN series compound semiconductor and the resistivity in the case where the compound semiconductor is treated with electron beam irradiation. The GaN series compound semiconductor layer employed had the structure in which a GaN buffer layer was formed on a substrate, and an Mg-doped p-type GaN layer was formed on the buffer layer. Thus obtained p-type-impurity-doped GaN series compound semiconductor layer was irradiated with electron beams having an acceleration voltage of 15 kV. During the irradiation, the temperature of the heating stage was varied, and the surface temperature of the p-type GaN layer was measured by a pyrometer. The measured temperatures and corresponding resistivities are plotted in the graph shown in FIG. 4. As is clear from FIG. 4, when the surface temperature of the semiconductor layer was somewhere between room temperature and 400° C., the resistivity was as high as $10^6$ Ω·cm. Around a surface temperature of 400° C., the resistivity began to decrease rapidly, and at 700° C., it was as low as 2.0 Ω·cm. At 600° C., the resistivity was still as high as 200 Ω·cm, and naturally, under 600° C., the resistivity was higher. In order to avoid this, the surface temperature of the GaN series compound semiconductor during electron beam irradiation should be in the range of 600° C.-1200° C. The irradiation can be performed at over 1200° C., but this may cause high cost. As stated above, according to the second aspect of the invention, there can be provided a stable low-resistivity p-type GaN series compound semiconductor layer at a high yield.

Figure 5:
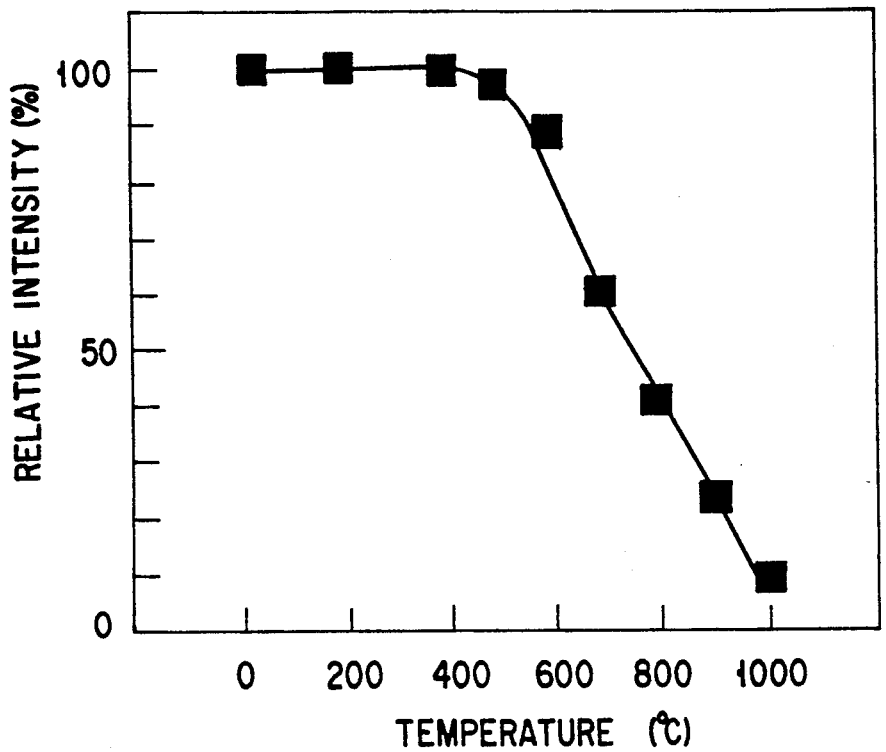
FIG. 5 is a graph showing the relationship between the surface temperature of a p-type III-V Group compound semiconductor during electron-beam irradiation and the relative intensity of the photoluminescence of the compound semiconductor irradiated at the temperature.

In the meantime, if the electron beam irradiation is carried out at a temperature of 600° C. or higher, decomposing is occurred in the surface portion of the GaN series compound semiconductor to form a number of nitrogen vacancies, degrading the crystallinity of the semiconductor layer. In order to explain this phenomenon, FIG. 5 shows the relationship between the surface temperature of the p-type GaN series compound semiconductor layer during the electron beam irradiation and the intensity of photoluminescence. Here, onto a p-type GaN layer formed on a substrate, electron beam irradiation with various spot diameters is carried out so as to gradually raise the surface temperature of the p-type GaN layer. Further, at several predetermined temperatures, He-Cd laser beams were irradiated on the p-type GaN layer, and the photoluminescence intensity at 450 nm was measured at each temperature. Thus, FIG. 5 is a graph showing the intensity of photoluminescence as a function of the surface temperature of the GaN compound.

As is clear from the figure, when the temperature exceeds 600° C., the intensity of blue-light emission gradually decreases. The reason why the intensity of the blue-light emission decreases is that the crystallinity of the semiconductor is degraded due to decomposition of GaN in the surface portion. Naturally, a blue light-emitting element formed using a sample having such a low intensity of light emission does not emit bright light.

In consideration of the above, the authors of the present invention found that decomposition of p-type GaN during electron beam irradiation can be prevented by providing a cap layer on the surface of the p-type GaN layer. The cap layer serves as a protection layer for the p-type GaN series compound semiconductor.

The material of this cap layer is arbitrary as long as it is formable on the surface of the p-type GaN layer and fairly stable at a temperature of 600° C. or higher. Preferable examples of the material are $Ga_xAl_{1-x}N$ ($0 \leq x \leq 1$), $In_yGa_{1-y}N$ ($0 \leq y \leq 1$), $SiO_2$, $Si_3N_4$, etc. Usually, the cap layer should have a thickness in the range of about 0.01-5 μm, preferably 0.01-1 μm. If the cap layer is thinner than 0.01 μm, the advantage as a protection layer cannot be sufficiently obtained, whereas if thicker than 5 μm, it takes a lot of work to remove the layer to expose the p-type GaN series compound semiconductor after annealing, i.e., not economical.

Figure 6:
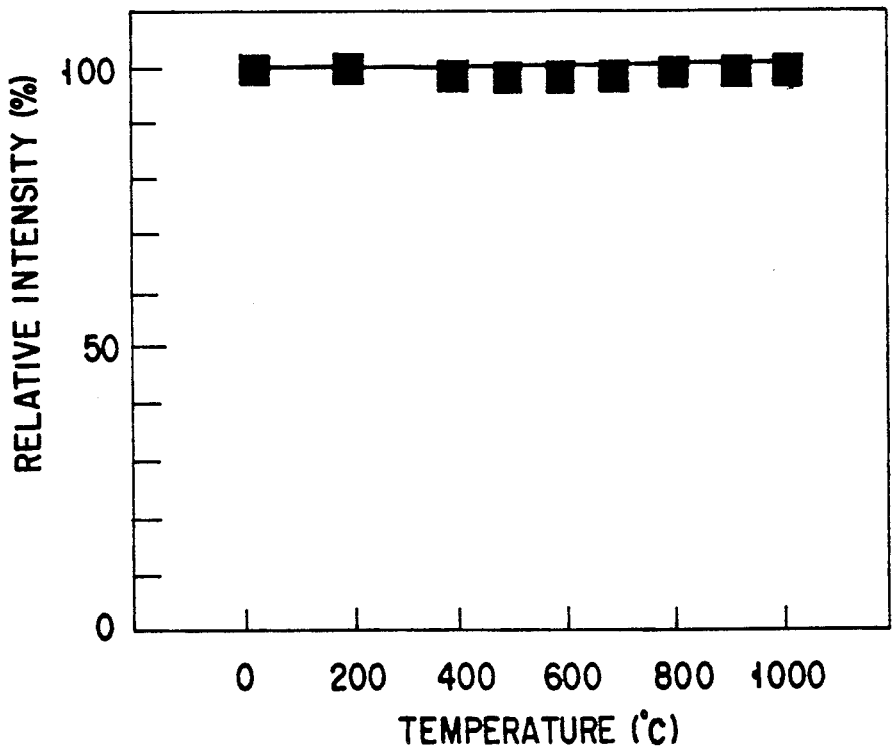
FIG. 6 is a graph showing the relationship between the surface temperature of a p-type III-V Group compound semiconductor having a cap layer during electron-beam irradiation and the relative intensity of the photoluminescence of the compound semiconductor irradiated at the temperature.

FIG. 6 is a graph showing the relationship between the surface temperature of a cap-layer-provided p-type GaN series compound semiconductor, and the intensity of photoluminescence in the case where the semiconductor is treated by electron beam irradiation. A 0.1 μm-thick $SiO_2$ layer was formed on the p-type GaN compound semiconductor as a protection layer, and electron-beam irradiation was carried out to the compound semiconductor through the cap layer. Then, the cap layer was removed by etching, and the photoluminescence intensity of the exposed p-type GaN layer was measured. The graph shown in FIG. 6 shows the photoluminescence intensity as a function of the temperature. As is apparent from FIG. 6, the intensity of 450 nm-light emission was not deteriorated at a temperature of 600° C., proving that the cap layer acted effectively to suppress the decomposition of GaN.

The reason why a low-resistivity p-type GaN series compound semiconductor can be obtained even in the electron beam irradiation at a temperature of 600° C. or higher is substantially the same as that stated in connection with the first aspect of the invention. Although a p-type-impurity-doped GaN series compound semiconductor exhibits a high resistivity, hydrogen bonded to Mg or Zn in the form of Mg-H or Zn H is released therefrom by heat when the semiconductor is heated over 600° C., especially 700° C. or higher. Thus, hydrogen leaves the p-type-impurity-doped GaN series compound semiconductor, and the p-type impurity such as Mg or Zn now free from hydrogen can act normally as an acceptor. Accordingly, a low-resistivity p-type GaN series compound semiconductor can be obtained.

The third aspect of the invention is directed to a method of manufacturing a p-type II-VI Group compound semiconductor element by a vapor phase epitaxy method, comprising the step of annealing the grown compound at a temperature of 300° C. or higher.

As stated, the annealing temperature is preferably 300° C. or higher. The annealing step may be carried out with keeping an annealing temperature constantly for at least 1 minute, preferably 10 minutes or more.

The annealing may be carried out in a vacuum, or in an $N_2$ atmosphere, or in an inert gas atmosphere of He, Ne, Ar or the like, or an atmosphere of a mixture gas thereof. Most preferably, the annealing should be performed in a II Group gas atmosphere, or VI Group gas atmosphere, or an atmosphere of a mixture gas thereof which is pressurized to a level or higher of the decomposing pressure for the II-VI group compound semiconductor at the annealing temperature. If such pressured II Group gas, VI Group gas, or mixture atmosphere is used for annealing the II-VI compound semiconductor, decomposition of the compound during annealing can be prevented.

As in the first and second aspects of the invention, a cap layer may be provided on the p-type-impurity-doped II-VI Group compound semiconductor layer so as to prevent decomposition of the compound by heat. Similarly, the cap layer serves as a protection layer. When the cap layer is formed on the compound semiconductor, decomposition thereof can be avoided during annealing, regardless of the pressure state, i.e. not only in a pressurized condition, a pressured-reduced condition, or atmospheric condition. Thus, a p-type II-VI Group compound semiconductor having a low resistivity and a high crystallinity can be obtained.

The cap layer may be made of an arbitrary material as long as it is formable on the II-VI Group compound, and stable even at a temperature of 300° C. or higher. Preferable examples thereof are a II-VI Group compound semiconductor, $Si_3N_4$, and $SiO_2$. Which is the most preferable material depends upon the annealing temperature. The cap layer, usually, should have a thickness in the range of about 0.01–5 μm as in the first and second aspects of the invention.

FIG. 7 is a graph showing the relationship between the annealing temperature and the resistivity of a ZnSe compound semiconductor into which nitrogen atoms (N) are doped as a p-type impurity. As is clear from FIG. 7, the ZnSe compound semiconductor layer was become a low-resistivity p-type layer by annealing. The ZnSe compound semiconductor used here was obtained in the following manner. A 4 μm-thick ZnSe layer was formed on a GaAs substrate while doping N into the layer in a stream of $NH_3$ as a source of a p-type impurity. In the same manner as described above some samples of ZnSe layers were obtained. Thus obtained ZnSe compound semiconductors were annealed for 10 minutes at various annealing temperatures respectively in an nitrogen atmosphere. The Hall measurement was conducted on the annealed ZnSe compound semiconductor layer, to obtain the resistivity thereof. The graph shown in FIG. 7 shows the resistivity as a function of the annealing temperature.

As is apparent from this figure, from an annealing temperature of 300° C. on, the resistivity of the N-doped ZnSe layer sharply dropped. When the annealing temperature increased at 400° C. or higher, a substantially constant low-resistivity p-type property was exhibited, indicating the effect of annealing. For comparison, the Hall measurement was conducted on a not-yet-annealed ZnSe layer, and the ZnSe layer annealed at 400° C. or higher. The results showed that the ZnSe layer before annealing exhibited a resistivity of 600 Ω·cm, and a hole carrier density of $1 \times 10^{15}/cm^3$, whereas those properties of the ZnSe layer after annealing were 0.8 Ω·cm, and $1 \times 10^{18}/cm^3$, respectively. Although this figure shows the case of ZnSe, it was found that the similar results can be obtained in connection with p-type-impurity-doped ZnS, CdS, CdSe, or a composite crystal thereof.

Further, the 4 μm-thick ZnSe layer annealed at 400° C. was etched to reduce the thickness to 2 μm, and the Hall measurement was carried out. The hole carrier density and resistivity were 0.7 Ω·cm, and $1 \times 10^{18}/cm^3$, respectively, which were substantially the same as those of the layer before the etching. Thus, it can be concluded that a p-type-impurity-doped ZnSe layer is converted by annealing into a layer having a uniform low-resistivity and p-type properties over the entire area and in the thickness direction.

The fourth aspect of the invention is directed to a method of manufacturing a p-type II-VI group compound semiconductor element by a vapor phase epitaxy method, comprising the step of irradiating electron beams on the grown compound while maintaining a surface temperature of said compound at 300° C. or higher.

The surface temperature is maintained preferably at a range of temperature of 400° to 800° C. or higher., however, when it exceeds 800° C., the compound semiconductor tends to be degraded.

Electron-beam irradiation is carried out usually at a acceleration voltage of 1 kV–30 kV, and an SEM, EPM, etc. may be used as an electron beam irradiation device.

As in the case of the third aspect of the invention, a cap layer can be provided.

An N-doped ZnSe semiconductor film grown by the MOCVD method as same as above was placed in an electron beam irradiation device, and irradiated with electron beams of an acceleration voltage of 10 kV while maintaining the surface temperature at 400° C. Before the irradiation, the resistivity and hole carrier density of the ZnSe layer were 600 Ω·cm, and $1 \times 10^{15}/cm^3$, respectively, whereas those of the layer after the irradiation were 0.8 Ω·cm, and $1 \times 10^{18}/cm^3$, respectively.

The reason why a low-resistivity p-type II-VI Group compound semiconductor can be obtained by annealing or electron beam irradiation in the third or fourth aspect is assumed as follows:

For growing a II-VI Group compound semiconductor layer, $NH_3$ is generally used as a source of N, which serves as a p-type dopant. During the growth, $NH_3$ decomposes to release atomic hydrogens. These hydrogen atoms bond to N doped as an acceptor impurity to prevent N from serving as an acceptor. Therefore, a II-VI Group compound semiconductor into which a impurity N is doped exhibits a high resistivity.

However, during annealing or electron beam irradiation after growth of the layers, hydrogen bonded to N in the form of N-H may be released therefrom by heat due to annealing, or excitation due to electron beam irradiation. Thus, hydrogen leaves the N-doped II-VI group compound semiconductor, and such nitrogen now free from hydrogen can acts normally as an acceptor. Accordingly, a low-resistivity p-type II-V Group compound semiconductor can be obtained. For the reason stated above, naturally, use of a gas containing hydrogen atoms such as $NH_3$, $H_2$, or the like during an annealing atmosphere is not preferable.

In the meantime, most preferably, the electron beam irradiation may be carried out at an acceleration voltage of 1 kV–30 kV so as to achieve a low resistivity with the highest reproducibility. If the acceleration voltage is lower than 1 kV, the energy of the electron beams tends to not have a level sufficient to release hydrogen atoms, whereas if it exceeds 30 kV, the electron energy gets so large that the sample temperature is raised too high even if a emission current is low. If the sample temperature is too high, the sample itself is broken, making it difficult to control the state of the sample.

In the first and second embodiments of the present invention, the reaction has used in the vapor phase epitaxy method contains trimethyl gallium as a gallium source, and an aluminum source selected from trimethyl aluminum and diethyl aluminum, an indium source selected from trimethyl indium, and a nitrogen source selected from ammonia and hydrazin.

EMBODIMENT 1

A sapphire substrate was well washed, and placed in the susceptor in the reaction vessel. After creating a vacuum in the container, the substrate was heated at 1050° C. for 20 min in a stream of hydrogen gas so as to remove an oxide present in the surface of the substrate. Then, the substrate temperature was cooled to 510° C. At a temperature of 510° C., TMG gas serving as a Ga source was introduced to the substrate at $27 \times 10^{-6}$ mol/min., and so were ammonia gas serving as an N source at 4.0 l/min., hydrogen gas serving as a carrier gas at 2.0 l/min, so as to grow a GaN buffer layer having a thickness of 200Å on the substrate.

Thereafter, supply of the TMG gas was stopped, and the substrate was again heated up to 1030° C. Onto the GaN buffer layer, the TMG gas was again introduced at $54 \times 10^{-6}$ mol/min, and so newly was Cp$_2$Mg (cyclopentadienylmagnesium) gas at $3.6 \times 10^{-6}$ mol/min for 60 min., and thus an Mg-doped GaN layer having a thickness of 4 μm was grown on the GaN buffer layer.

After cooling down, the substrate now having the above-described layers was taken out of the reaction vessel, and transferred into an annealing device, where these layers were annealed in a nitrogen atmosphere at atmospheric pressure and 800° C. for 20 minutes.

A Hall measurement was conducted on the annealed Mg-doped GaN layer. The result indicated that the Mg-doped GaN layer had good p-type characteristics, i.e., a resistivity of 2 Ω·cm and a hole carrier density of $2 \times 10^{17}$/cm$^3$.

EMBODIMENT 2

A GaN buffer layer and Mg-doped GaN layer were grown as in Embodiment 1. Then, supply of the Cp$_2$Mg gas was stopped, and a 0.5 μm-thick-GaN layer was grown thereon as a cap layer.

As in Embodiment 1, these layers were annealed in a nitrogen/argon mixture gas at atmospheric pressure and 800° C. for 20 minutes in an annealing device. Then, etching was performed on the substrate to remove the 0.5 μm-thick-cap layer from the surface portion, and this the Mg-doped GaN layer was exposed. A Hall measurement was conducted on the annealed Mg-doped GaN layer as in Embodiment 1. The result indicated that the Mg-doped GaN layer exhibited good p-type characteristics, i.e., a resistivity of 2 Ω·cm and a hole carrier density of $1.5 \times 10^{17}$/cm$^3$. Further, the intensity of blue-light emission of photoluminescence at 450 nm was about 4 times as much as that of the GaN layer obtained in Embodiment 1.

EMBODIMENT 3

A GaN buffer layer and Mg-doped GaN layer were grown on a substrate as in Embodiment 1. Then, the substrate was transferred from the reaction vessel to an annealing device. These layers were annealed in a nitrogen gas at a pressure of 20 atms, and at a temperature of 800° C. for 20 minutes in the annealin device. A Hall measurement was conducted on the annealed Mg-doped GaN layer. The result indicated that the Mg-doped GaN layer exhibited good p-type characteristics, i.e., a resistivity of 2 Ω·cm and a hole carrier density of $2.0 \times 10^{17}$/cm$^3$. Further, the intensity of blue light emission of photoluminescence at 450 nm was about 4 times as much as that of the GaN layer obtained in Embodiment 1.

EMBODIMENT 4

A GaN buffer layer and Mg-doped GaN layer were grown on a substrate as in Embodiment 1. Then, the substrate was transferred from the reaction vessel to a plasma CVD device, where a 0.5 μm-thick-SiO$_2$ layer serving as a cap layer was formed on the Mg-doped GaN layer.

After that, the substrate having these layers were put in an annealing device, where these layers were annealed in a nitrogen/argon mixture gas at atmospheric pressure and 1000° C. for 20 minutes. Then, the SiO$_2$ cap layer was removed with hydrofluoric acid to expose the Mg-doped GaN layer. A Hall measurement was conducted on the annealed and Mg-doped GaN layer. The result indicated that the Mg-doped GaN layer exhibited good p-type characteristics, i.e., a resistivity of 2 Ω·cm and a hole carrier density of $2.0 \times 10^{17}$/cm$^3$.

For comparison, an Mg-doped GaN layer was formed on a substrate in the same manner as described above except that no cap layer was formed. It was found that the Mg-doped GaN layer with a cap layer formed thereon while annealing exhibited about 20 times as much intensity of blue-light emission of photoluminescence at 450 nm of about as that of the Mg-doped GaN layer annealed without a cap layer formed thereon.

EMBODIMENT 5

A GaN buffer layer and Mg-doped GaN layer were grown on a sapphire substrate as in Embodiment 1, and then, supply of the Cp$_2$Mg gas was stopped. After that, TMA gas and SiH$_4$ (monosilane) gas were newly introduced at $6 \times 10^{-16}$ mol/min, and $2.2 \times 10^{-10}$ mol/min, respectively, for 20 minutes so as to grow a 0.8 μm-thick Si-doped n-type Ga$_{0.9}$Al$_{0.1}$N layer on the Mg-doped GaN layer.

Supply of the TMG gas, TMA gas, and SiH$_4$ gas was stopped. While introducing hydrogen gas and ammonia gas, the substrate was cooled down to room temperature. Then, the substrate now having these layers was transferred from the vessel into an annealing device, where these layers were annealed in a nitrogen/argon mixture gas at atmospheric pressure and 700° C. for 20 minutes.

Thus, obtained was an element having a single hetero structure, i.e., a p-type GaN layer, and an n-type Ga$_{0.9}$Al$_{0.1}$N layer were formed on the sapphire.

Next, a part of n type Ga$_{0.9}$Al$_{0.1}$N layer was etched by a general method so as to expose a part of p-type GaN layer. Then, an ohmic electrode is provided for each of the layers, and the element was cut into chip-like pieces by a dicing saw. Each of the electrodes were taken out from the n-type and p-type layers exposed on each chip. Each chip was molded into a blue-light emitting diode. The obtained light emitting diode exhibited characteristics, i.e., blue-light emission with a peak wavelength at 430 nm, an output power of 90 μW, and a forward voltage of 5V, at a forward current of 20 mA. The exhibited light-emitting output of the blue-light emitting diode was as high as never reported before.

CONTROL 1

A light-emitting diode having a similar single hetero structure to that of Embodiment 5 was manufactured in a similar manner to that of Embodiment 5 except that in Control 1 annealing was not carried out. The obtained light-emitting diode exhibited a forward voltage of as high as 60V for a forward current of 20 mA. A slight yellow-like color light emission was generated, but the diode was broken as soon as it was turned on. Thus, the light emission output could not be measured.

EMBODIMENT 6

A 200Å-thick GaN buffer layer was grown on a sapphire substrate as in Embodiment 1.

Then, supply of the TMG gas was stopped, and the temperature was raised to 1030° C. After that, TMG gas was introduced at $54 \times 10^{-6}$ mol/min, and SiH$_4$ (monosilane) gas was newly at $2.2 \times 10^{-10}$ mol/min, for 60 minutes so as to grow a 4 μm-thick Si-doped n-type GaN layer on the GaN butter layer.

Next, supply of the SiH$_4$ gas was stopped, and while introducing a stream of Cp$_2$Mg gas at $3.6 \times 10^{-6}$ mol/- min for 30 minutes, a 2.0 μ-thick Mg-doped GaN layer was grown.

After that, supply of the TMG gas and Cp$_2$Mg gas was stopped, and in a stream of hydrogen gas and ammonia gas, the layers formed on the substrate were cooled down to room temperature. Then, the gas stream in the reaction vessel was replaced with that of nitrogen gas. In a stream of nitrogen gas, the temperature in the reaction vessel was raised to 1000° C., and held at the temperature for 20 minutes, to carry out annealing of these layers.

A light-emitting diode was made from thus obtained element as in Embodiment 4, and the light-emitting diode was turned on. The diode generated blue light with a light emission peak at 430 nm, and exhibited characteristics, i.e., an output power of 50 μW at 20 mA and a forward voltage of 4V at 20 mA.

CONTROL 2

A light-emitting diode having a similar homo GaN structure was manufactured in a similar manner to that of Embodiment 6 except that annealing was not carried out. The obtained light-emitting diode exhibited a forward voltage of as high as 40V at a forward direction current of 20 mA. A slight yellow like color light emission was generated, but the diode was broken as soon as it was turned on. Thus, the light emission output could not be measured.

The following are embodiments in the case where the grown GaN compound layer was treated with electron beam irradiation.

EMBODIMENT 7

As in embodiment 1, a GaN buffer layer having a thickness of 250Å was grown on a substrate.

Thereafter, supply of the TMG gas was stopped, and the temperature of the substrate was again raised up to 1030° C. Onto the GaN buffer layer, the TMG gas was again introduced at $54 \times 10^{-6}$ mol/min, and newly so was Cp$_2$Mg (cyclopentadienylmagnesium) gas at $3.6 \times 10^{-6}$ mol/min for 60 min., and thus an Mg-doped GaN layer having a thickness of 4 μm was grown on the GaN buffer layer.

After cooled down, the substrate now having the above-described layers was taken out of the reaction vessel, and transferred into an electron beam irradiation device, where these layers were irradiated with electron beams having an acceleration voltage of 15 kV while maintaining the surface temperature of the GaN layer at 800° C. by a heater.

The Hall measurement was conducted on the electron-beam-irradiated Mg-doped GaN layer. The results indicated that the obtained Mg-doped GaN layer had good p-type characteristics, i.e., a resistivity of 2 Ω·cm and a hole carrier density of $2 \times 10^{17}$/cm$^3$.

EMBODIMENT 8

A GaN buffer layer and Mg-doped GaN layer were grown as in Embodiment 7. Then, supply of the Cp$_2$Mg gas was stopped, and a 0.1 μm-thick-GaN layer was grown thereon as a cap layer.

As in Embodiment 7, these layers were irradiated with electron beams in the electron beam irradiation device while maintaining the surface temperature of the GaN layer at 800° C. Then, etching was performed to remove the 0.1 μm-thick-cap layer from the surface portion, and thus the Mg-doped GaN layer was exposed. A Hall measurement was conducted on the obtained Mg-doped GaN layer as in Embodiment 1. The result indicated that the Mg-doped GaN layer had good p-type characteristics including a resistivity of 2 Ω·cm. Further, the intensity of blue-light emission of photoluminescence at 450 nm was about 4 times as high as that of the GaN layer obtained in Embodiment 1.

EMBODIMENT 9

An Mg-doped GaN layer was grown on a substrate as in Embodiment 7. Then, the substrate was transferred from the reaction vessel to a plasma CVD device, where a 0.2 μm-thick SiO$_2$ layer was formed thereon as a cap layer.

After that, electron beam irradiation was carried out to the obtained layer with maintaining the surface temperature at 800° C. in the irradiation device. Then, the SiO$_2$ cap layer was removed with hydrofluoric acid to expose the Mg-doped GaN layer. A Hall measurement was conducted on the obtained Mg-doped GaN layer. The result indicated that the Mg-doped GaN layer had good p-type characteristics, i.e., a resistivity of as low as 2 Ω·cm and a hole carrier density of $2.0 \times 10^{-17}$/cm$^3$. Further, the photoluminescence intensity at 450 nm was about 4 times as high as that obtained in Embodiment 7.

EMBODIMENT 10

As in embodiment 7, an Mg-doped GaN layer was grown on a substrate in a reaction vessel, and the substrate was transferred into a plasma CVD device, where a 0.5 μm-thick Si$_3$O$_4$ layer was formed on the grown layer as a cap layer.

By use of an electron beam irradiation device, the obtained layers were irradiated with electron beams having an acceleration voltage of 15 kV while maintaining the surface temperature of the GaN layer at 1000° C. by a heater. Then, the Si$_3$N$_4$ layer was removed by etching to expose the Mg-doped GaN layer. The Hall measurement was conducted on the electron-beam-irradiated Mg doped GaN layer. The results indicated that the obtained Mg-doped GaN layer had good p-type characteristics, i.e., a resistivity of 2 Ω·cm and a hole carrier density of $2 \times 10^{17}$/cm$^3$.

For comparison, an Mg-doped GaN layer was formed on a substrate in the same manner as described above except that no cap layer was formed. It was found that the Mg-doped GaN layer with a cap layer formed thereon had about 15 times as high intensity of blue-light emission of photoluminescence at 450 nm as that of the Mg-doped GaN layer without a cap layer.

EMBODIMENT 11

A 250Å-thick GaN buffer layer was grown on a sapphire substrate as in Embodiment 7.

Then, supply of the only TMG gas was stopped, and the temperature was raised to 1030° C. After that, TMG gas was introduced at $54 \times 10^{-6}$ mol/min, and SiH$_4$ (monosilane) gas was newly at $2.2 \times 10^{-10}$ mol/min, for 60 minutes so as to grow a 4 μm-thick Si-doped n-type GaN layer on the buffer layer.

Next, supply of the SiH$_4$ gas was stopped, and while introducing a stream of Cp$_2$Mg gas at $3.6 \times 10^{-6}$ mol/min for 10 minutes, a 0.5 μ-thick Mg-doped GaN layer was grown.

After that, supply of the TMG gas and Cp$_2$Mg gas was stopped, and in a stream of hydrogen gas and ammonia gas, the layers formed on the substrate were cooled down to room temperature. Then, the substrate was transferred into a plasma CVD device, where an SiO₂ cap layer having a thickness of 0.1 μm was formed. Next, as in Embodiment 7, by use of an electron beam irradiation device, these layers were irradiated with electron beams while maintaining the surface temperature of the layer at 800° C.

The cap layer was removed by dipping it into hydrofluoric acid, and a part of the p-type GaN layer of the obtained element was etched so as to expose a part of n-type GaN layer. Then, an ohmic electrode is provided for each of the layers, and the element was cut into chip-like pieces by a dicing saw Each of the electrodes were taken out from the n-type and p-type layers exposed on each chip. Each chip was molded into a blue-light-emitting diode. The obtained light-emitting diode exhibited characteristics, i.e., blue-light emission with a peak wavelength at 430 nm, an output power of 50 μW at 20 mA, and a forward voltage of 4V at 20 mA.

For comparison, another blue emitting element was obtained by electron beam irradiation in the same manner as above except that no cap layer was provided in this case. Using this blue light emitting element, a blue light emitting diode was obtained. The results of the measurement showed that the Mg-doped GaN layer without a cap layer had an output power of 10 μW at 20 mA. Although the foregoing describes with respect to embodiments of $Ga_xAl_{1-x}N$ (where $0 \leq x \leq 1$) compound semiconductors, a III-V Group compound semiconductor according to the present invention is not limited to the $Ga_xAl_{1-x}N$ and also a $In_yGa_{1-y}N$ can be used.

The following are embodiments of manufacturing a p-type II-VI Group compound semiconductor.

EMBODIMENT 12

A GaAs substrate was well washed, and placed in the susceptor in the reaction vessel. After creating a vacuum in the container, the substrate was heated at 600° C. for 10 min. in a stream of hydrogen gas so as to remove the oxidized surface portion of the substrate. Then, the substrate temperature was lowered to 350° C. As maintaining a temperature of 350° C., in a 60-minutestream of DEZ gas serving as a Zn source at $4.0 \times 10^{-6}$ mol/min., H₂Se gas serving as an Se source at $100 \times 10^{-6}$ mol/min., and NH₃ gas as a source of N which serves as a p-type dopant at $200 \times 10^{-6}$ mol/min, and hydrogen gas serving as a carrier gas at 2.0 l/min, an N-doped ZnSe layer having a thickness of 4 μm was grown on the substrate. A Hall measurement was carried out on the grown N-doped ZnSe layer, and the results showed that the obtained N-doped ZnSe layer had a resistivity of as high as 600 Ω·cm and a Hall carrier density of $1 \times 10^{15}/cm^3$.

Next, the substrate having the layers was taken out of the reaction vessel, and transferred into an annealing device, where these layers were annealed in a nitrogen atmosphere at atmospheric pressure and 400° C. for 20 minutes. A Hall measurement was conducted on the annealed and N-doped ZnSe layer. The result indicated that the N-doped ZnSe layer had good p-type characteristics, i.e., a resistivity of 0.8 Ω·cm and a hole carrier density of $1 \times 10^{18}/cm^3$.

EMBODIMENT 13'

A GaAs substrate having a N-doped ZnSe layer grown thereon as in Embodiment 12 in a reaction vessel, was transferred into an electron beam irradiation device, where electron beam irradiation wa carried out to the grown N-doped ZnSe layer at an acceleration of 10 kV. A Hall measurement was conducted on the obtained N-doped ZnSe layer. The results indicated that the N-doped ZnSe layer had good p-type characteristics, i.e., a resistivity of as low as 0.7 Ω·cm and a hole carrier density of $1 \times 10^{18}/cm^3$.

EMBODIMENT 14

An N-doped ZnSe layer was grown on a GaAs substrate as in Embodiment 12, and then a 0.1 μm-thick ZnSe layer was grown thereon as a cap layer.

After that, as in Embodiment 12, the obtained substrate was annealed in an annealing device. Then, the surface portion corresponding to a 0.1 μm-thick layer was stripped by etching to remove the cap layer, thereby exposing the N-doped ZnSe layer. A Hall measurement was conducted on the obtained N-doped ZnSe layer. The result indicated that the N-doped ZnSe layer exhibited good p-type characteristics, i.e., a resistivity of 0.6 Ω·cm and a hole carrier density of $3 \times 10^{18}/cm^3$.

EMBODIMENT 15

An N-doped ZnSe layer was grown on a GaAs substrate as in Embodiment 12, and the obtained substrate was transferred from the reaction vessel to a plasma CVD device, where a 0.2 μm-thick-SiO₂ layer serving as a cap layer was formed on the N-doped ZnSe layer.

After that, as in Embodiment 13, onto the entire surface of the obtained layer, electron beam irradiation was carried out at an acceleration of 15 kV. Then, the SiO₂ cap layer was removed by hydrofluoric acid to expose the N-doped ZnSe layer. A Hall measurement was conducted on the obtained N-doped ZnSe layer. The results indicated that the N-doped ZnSe layer had good p-type characteristics, i.e., a resistivity of as low as 0.6 Ω·cm and a hole carrier density of $2.0 \times 10^{18}/cm^3$.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a p-type III-V nitride compound semiconductor by a vapor phase epitaxy method, comprising the steps of:
   growing a III-V nitride compound semiconductor by using a reaction gas containing a p-type impurity; and
   annealing said nitride compound semiconductor at a temperature above 400° C.

2. A method according to claim 1, wherein said nitride compound semiconductor is represented by general formula $Ga_xAl_{1-x}N$ (where $0 \leq x \leq 1$).

3. A method according to claim 1, wherein a temperature of said annealing is in the range of 600° C.-1200° C.

4. A method according to claim 1, wherein a cap layer is provided on said nitride compound semiconductor before annealing.

5. A method according to claim 4, wherein said cap layer is made of at least one material selected from the group consisting of $Ga_xAl_{1-x}N$ (where $0 \leq x \leq 1$), $In_yGa_{1-y}N$ (where $0 \leq y \leq 1$), Si₃N₄, and SiO₂.

6. A method according to claim 1, wherein said annealing is carried out in a nitrogen atmosphere pressurized to a point of a decomposition pressure of the III-V nitride compound semiconductor at said annealing temperature, or higher.

7. A method according to claim 1, wherein said reaction has contains at least one of a gallium source of trimethyl gallium, and an aluminum source selected from the group consisting of trimethyl aluminum and diethyl aluminum, an indium source selected from the group consisting of trimethyl indium and diethyl indium, and a nitrogen source selected from the group consisting of ammonia and hydrazin.

8. A method according to claim 1, wherein said p-type impurity is at least one selected the group consisting of Zn, Cd, Be, Mg, Ca, and Ba.

* * * * *